United States Patent [19]

Wilczak

[11] Patent Number: 4,963,462
[45] Date of Patent: Oct. 16, 1990

[54] POSITIVE WORKING, PEEL DEVELOPABLE, COLOR PROOFING SYSTEM HAVING TWO PHOTOSENSITIVE LAYERS

[75] Inventor: Wojciech A. Wilczak, Jersey City, N.J.

[73] Assignee: Hoechst Celanese Corporation, Somerville, N.J.

[21] Appl. No.: 462,177

[22] Filed: Jan. 8, 1990

[51] Int. Cl.$^5$ .................. G03C 5/18; G03C 3/02; G03C 11/12
[52] U.S. Cl. .................. 430/143; 430/157; 430/162; 430/165; 430/175; 430/193; 430/253; 430/254; 430/257; 430/258; 430/262; 430/280; 430/285; 430/288; 430/293; 430/906; 430/909
[58] Field of Search .............. 430/260, 257, 258, 253, 430/261, 252, 157, 162, 143

[56] References Cited

U.S. PATENT DOCUMENTS

| | | |
|---|---|---|
| 4,210,711 | 7/1980 | Katajima et al. |
| 4,260,673 | 4/1981 | Krech |
| 4,284,703 | 8/1981 | Inoue et al. |
| 4,288,525 | 9/1981 | Sheperd et al. |
| 4,347,700 | 9/1982 | Shimazu et al. |
| 4,396,700 | 8/1983 | Katajima et al. |
| 4,489,154 | 12/1984 | Taylor |
| 4,511,641 | 4/1985 | Busman et al. |
| 4,571,372 | 2/1986 | Vikesland |
| 4,650,738 | 3/1987 | Platzer et al. |
| 4,659,642 | 4/1987 | Platzer et al. |
| 4,687,727 | 8/1987 | Toyama et al. |
| 4,762,766 | 8/1988 | Melbye |
| 4,783,390 | 11/1988 | Mino et al. ............ 430/143 |

*Primary Examiner*—Paul R. Michl
*Assistant Examiner*—John S. Y. Chu
*Attorney, Agent, or Firm*—Richard S. Roberts

[57] ABSTRACT

This invention relates to positive working color proofing sheet construction which, upon exposure to an actinic radiation source through a screened image, can accuratley reprouce said image. The construction is useful as a color proofing film which can be employed to accurately predict the image quality from a lithographic printing process. The image is prodtced by forming a composite of a receiver base, diazo or diazide layer, photopolymerizable layer and cover sheet. Upon imagewise exposure, a positive image appears on the receiver base after dry peel apart development.

21 Claims, No Drawings

POSITIVE WORKING, PEEL DEVELOPABLE, COLOR PROOFING SYSTEM HAVING TWO PHOTOSENSITIVE LAYERS

BACKGROUND OF THE INVENTION

The present invention relates to color proofing films, or more particularly to positive working, peel-apart photosensitive element capable of producing positive images upon treatment with actinic radiation and peel development.

In the art of lithographic printing, it is desirable to produce a multi-color proof to assist the printer in correcting a set of color separation films prior to using them to produce printing plates. The proof should reproduce the color quality that will be obtained during the printing process. The proof must be a consistent duplicate of the desired halftone image. Examination of the color proof should show the color rendition to be expected from press printing using the color separations and any defects on the separations which might need to be altered before making the printing plates. Proofing sheets for multicolored printing can be made by using a proof press, however, this requires that all of the actual printing steps be performed. This conventional method of color proofing is costly and time consuming. Photoimaging processes can also be used to produce a color proof. There are two general types of photoimaging methods. These are the overlay type and the single sheet type.

In the overlay type of color proofing, an independent transparent plastic support is used for producing an image of each color separation film by applying a photosensitive solution of the corresponding color. A number of these supports carrying images of the corresponding colors are then superimposed upon each other over a white sheet to produce a color imaging composite. The advantage of the overlay method is that proofs can be made quickly and can serve as a progressive proof by combining any two or three colors in register. This type of color proofing has the disadvantage that the superimposed plastic supports tend to darken the color proofing sheet. As a result, the impression of the color proofing composite thus prepared is different from that of copies actually obtained with conventional printing presses and with proof presses. Examples of such overlay approaches are contained in U.S. Pat. Nos. 3,136,637; 3,211,553; and 3,326,682.

In the single sheet type color proofing, a color proofing sheet is prepared by successively producing images of different colors from color separation films on a single receiver sheet. This can be accomplished by sequentially applying colorants or colored, photosensitive layers to a single opaque support. This method more closely resembles the actual printing process and eliminates the color distortion inherent in the overlay system. Examples of such single sheet approaches are contained in U.S. Pat. Nos. 3,671,236; 4,260,673; 4,366,223; 4,650,738; 4,656,114; 4,659,642; and U.S. Pat. No. 3,574,049.

Various processes for producing single sheet color proofs of an image embodying thermal transfer and photopolymerization techniques are known, for example, from U.S. Pat. Nos. 3,060,023; 3,060,024; 3,060,025; 3,481,736; and 3,607,264. In these processes, a photopolymerizable layer coated on a suitable support is imagewise exposed through a color separation film. The surface of the exposed layer is then pressed into contact with an image receptive surface of a separate element. At least one of the said elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material.

In U.S. Pat. No. 3,721,557, a method for transferring colored images is shown which provides a stripping layer coated between a photosensitive element and a support. When the photosensitive layer is exposed to actinic light and developed, the more soluble portions are selectively removed to produce a visible image. The image carrying support is pressed against an adhesive coated receptor member and the carrier support is subsequently stripped to accomplish the transfer of the image. A fresh layer of adhesive must be applied to the receptor for each subsequent transfer.

U.S. Pat. No. 4,596,757 provides a method for transferring images or solid colors which are subsequently imaged. The photosensitive material comprises a carrier support having sequentially disposed thereon a release layer; a colored, photopolymerizable layer; and an adhesive layer. The material can undergo exposure, lamination to a temporary support, wet development, and then lamination to a receptor sheet. Alternatively, the photosensitive material can be laminated to a receptor sheet, undergo exposure, and then wet processed. Both processes require development in an aqueous medium.

In U.S. Pat. No. 4,489,154, a process is claimed which produces a single layer color proof without wet developmnet. The photosensitive material comprises a strippable cover sheet; a colored photoadherent layer; a nonphotosensitive organic contiguous layer; and a sheet support. The material is exposed and peel developed. The positive or negative image is transferred to a receiver base. A fresh layer of adhesive must be applied to the receptor for each subsequent transfer.

In the present invention, one produces a color proofing article having two photosensitive layers. The element sequentially comprises a strippable cover sheet which is transparent to actinic radiation; a photopolymerizable layer, containing at least one ethylenically unsaturated polymerizable material and a photoinitiator; a photosensitive layer, containing a diazonium or o-quinonediazide compound, a polymeric binder, and a colorant; a thermoplastic, polymeric adhesive layer; and a support sheet. A color proofing film having improved image quality has been found by using both photopolymer and diazonium or o-quinonediazide layers in the article of this invention.

Peel-apart imaging systems based on peel-differentiation of exposed/unexposed layers containing diazonium salts or o-quinonediazides are known as exemplified by U.S. Pat. No. 4,334,006. Image differentiation is based on laminating a developing sheet onto the previously exposed diazonium or o-quinonediazide layer and a differential adhesion between exposed and unexposed areas of the diazonium or o-quinonediazide layer and the developing sheet during peel development. However, such systems provide too little differentiation because the differentiation between exposed and unexposed areas for diazonium salt or o-quinonediazide layers, while significant for wet development, is relatively small for peel development.

It has been unexpectedly found that a polymerizable layer, in intimate contact with the diazonium/o-quinonediazide layer, helps significantly in providing the desired differentiation in peel development. It has been found that when the photoinitiator is omitted in the photopolymer layer, which means that no polymerization occurs in this layer and the only differentiation which occurs is based on adhesion between the two layers alone, no image is obtained even after prolonged exposures. The article of the present invention provides consistent excellent quality reproductions by a peel development process.

SUMMARY OF THE INVENTION

The invention provides a positive-acting proofing sheet which comprises, in order:

(i) a strippable, transparent cover; and (ii) a photopolymerizable composition layer on said cover, which photopolymerizable layer comprises a photoinitiator, a free radical polymerizable component having at least one ethylenically unsaturated group, and an optional organic binding resin, wherein said photoinitiator is present in sufficient amount to initiate the free radical polymerization of said polymerizable component upon exposure to sufficient actinic radiation, and wherein said polymerizable component is present in sufficient amount to provide image differentiation when the composition is imagewise exposed to actinic radiation; and wherein said optional binding resing, when present, is in sufficient amount to bind the composition components into a uniform film, and (iii) a photosensitive composition layer directly on said photopolymerizable composition, high photosensitive layer comprises an organic binder, a light sensitive polymeric diazonium compound or o-quinone diazide compound, and a colorant, wherein said binder is present in sufficient amount to bind the composition components into a uniform film, and wherein said light sensitive compound is present in sufficient amount to provide image differentiation when the photosensitive composition is imagewise exposed to actinic radiation; and wherein said colorant is present in an amount sufficient to uniformly color the layer; and (iv) an adhesive layer directly adhered to said photosensitive layer, which adhesive layer comprises a thermoplastic resin which has a $T_g$ in the range of from about 25° C. to about 100° C.; and (v) a support sheet attached to the adhesive layer.

The invention also provides a method for producing a positive image which comprises:

(a) providing a photopolymerizable element which comprises:

(i) a strippable, transparent cover; and (ii) a photopolymerizable composition layer on said cover, which photopolymerizable layer comprises a photoinitiator, a free radical polymerizable component having at least one ethylenically unsaturated group, and an optical organic binding resin, wherein said photoinitiator is present in sufficient amount to initiate the free radical polymerization· of said polymerizable component upon exposure to sufficient actinic radiation, and wherein said polymerizable component is present in sufficient amount to provide image differentiation when the composition is imagewise exposed to actinic radiation; and wherein said optional binding resin, when present, is in sufficient amount to bind the composition components into a uniform film, and (b) providing a photosensitive element which comprises (i) a support sheet; and (ii) an adhesive layer directly adhered to said support sheet, which adhesive layer comprises a thermoplastic resin which has a $T_g$ in the range of from about 25° C. to about 100° C.; and (iii) a photopolymerizable composition layer on said cover, which photopolymerizable layer comprises a photoinitiator, a free radical polymerizable component having at least one ethylenically unsaturated group, and an optional organic binding resin, wherein said photoinitiator is present in sufficient amount to initiate the free radical polymerization of said polymerizable component upon exposure to sufficient actinic radiation, and wherein said polymerizable component is present in sufficient amount to provide image differentiation when the composition is imagewise exposed to actinic radiation; and wherein said optional binding resin, when present, is in sufficient amount to bind the composition components into a uniform film, and (c) laminating the photopolymerizable element to the photosensitive element at elevated temperature and pressure such that the photosensitive composition layer adheres to the photopolymerizable composition layer; and (d) then imagewise exposing said photosensitive composition and said photopolymerizable composition through the transparent cover to actinic radiation; and (e) peeling apart said support sheet and said transparent cover thereby forming a positive image on the adhesive layer on said support.

The invention further provides a method for producing a positive image which comprises (a) providing a photopolymerizable element which comprises:

(i) a strippable, transparent cover; and (ii) a photopolymerizable composition layer on said cover, which photopolymerizable layer comprises a photoinitiator, a free radical polymerizable component having at least one ethylenically unsaturated group, and an optional organic binding resin, wherein said photoinitiator is present in sufficient amount to initiate the free radical polymerization of said polymerizable component upon exposure to sufficient actinic radiation, and wherein said polymerizable component is present in sufficient amount to provide image differentiation when the composition is imagewise exposed to actinic radiation; and wherein said optional binding resin, when present, is in sufficient amount to bind the composition components into a uniform film; and (b) providing a photosensitive element which comprises (i) a support sheet; and (ii) a photosensitive composition layer directly on said support sheet, which photosensitive layer comprises an organic binder, a light sensitive polymeric diazonium compound or o-quinone diazide compound, and a colorant, wherein said binder is present in sufficient amount to bind the composition components into a uniform film, and wherein said light sensitive compound is present in sufficient amount to provide image differentiation when the photosensitive composition is imagewise exposed to actinic radiation; and wherein said colorant is present in an amount sufficient to uniformly color the layer; and (iii) an adhesive layer directly adhered to said photosensitive layer, which adhesive layer comprises a thermoplastic resin which has a $T_g$ in the range of from about 25° C. to about 100° C.; and (c) providing a receiver sheet; and (d) laminating the photosensitive element to the receiver sheet with heat and pressure such that the adhesive layer adheres to the receiver sheet and thereafter removing the support sheet thereby transferring the adhesive layer and photosensitive composition layer to the receiver sheet; and (e) laminating the photopolymerizable layer to the photosensitive layer at elevated temperature and pressure such that the photopolymerizable composition layer adheres to the photosensitive composition layer; and (f) then imagewise exposing said photosensitive composition and said photopolymerizable composition through the transparent cover to actinic radiation; and (g) peeling apart said receiver sheet and said transparent cover thereby forming a positive image on the adhesive layer on said receiver sheet; and (h) optionally repeating steps (a), (b) and (d) through (g) at least once wherein another photosensitive element according to step (b) having at lesat one different colorant is transferred via its adhesive layer to the positive image on the receiver sheet produced from the previous photosensitive element and photopolymerizable element.

DETAILED DESCRIPTION OF THE PREFERRED EMBODIMENT

In the usual full color proofing guide, four distinct colored images are formed, namely magenta, cyan, yellow, and black. When the images are superimposed upon each other, a simulated full color reproduction results. As hereinbefore described, one begins the process of the present invention by preparing a photopolymerizable element which has a cover and carried thereon a photopolymerizable layer.

In the preferred embodiment, the cover may be composed of any suitable flexible sheet material provided it is transparent to the actinic radiation for the photopolymerizable layer. In the preferred embodiment, it has an adhesion promoted or corona treated surface. It should also preferably be dimensionally stable when undergoing the herein specified treatment process. That is, it should have substantially no change in dimensions under heating in the range of approximately 60° C. to 120° C. during lamination. One preferred material is polyethylene terephthalate. In the preferred embodiment it has a thickness of from about 1 to about 10 mils, a more preferred thickness is from about 2 to about 5 mils and most preferably from about 2 to about 3 mils. Suitable films nonexclusively include Melinex 054, 504, 505, and 582 available from ICI, and Hostaphan 4400, 4500, and 4540 available from Hoechst Celanese Corporation. The surface of the support may be smooth or it may be provided with a matte texture as with Melinex 475. A smooth surface is preferred because a rough surface scatters the actinic radiation and thereby reduces the resolution capability of the element.

The photopolymerizable layer is applied from a solvent coating composition to the cover. Organic solvents are preferred for the photopolymerizable coating because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, and gamma-butyrolactone.

A typical photopolymerizable layer comprises a photopolymerizable monomer, photoinitiator, binding resin, and optional other ingredients known in the art.

The photopolymerizable material preferably comprises an addition polymerizable, non-gaseous (boiling temperature above 100° C. at normal atmospheric pressure), ethylenically-unsaturated compound containing at least one and preferably at least two terminal ethylenically unsaturated groups, and being capable of forming a high molecular weight polymer by free radical initiated, chain propagating addition polymerization. The most preferred compounds are acrylate or methacrylate monomers as are well known in the art. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, trimethylolpropane propoxylate triacrylate and bisphenol A diepoxide dimethacrylate.

Free radical liberating photoinitiators include any compound which liberate free radicals on stimulation by actinic radication. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon-substituted aromatic acyloins in U.S. Pat. No. 2,722,512; polynuclear quinones in U.S. Pat. Nos. 2,951,758 and 3,046,127; and s-triazines in U.S. Pat. No. 4,656,272. The most preferred photoinitiators include 2,3-di(4-methoxyphenyl)quinoxaline, 9-phenylacridine, bis(2,4,5-triphenyl)imidazole, bis-trichloromethyl-s-triazine and their derivatives.

The photopolymerizable layer may also contain a binding resin which not only determines the hardness and/or flexibility of the coating but is also used to control the dry development. Binding resins found suitable for the layer are polyvinyl acetates, styreen/maleic anhydride copolymers and their half esters; acrylic polymers and copolymers; polyamides; polyvinyl pyrolidones; cellulose and its derivatives; phenolic resins; and the like. The most preferred binding resins are polyvinyl acetates and acetals, such as UCARS from Union Carbide, and polyvinyl butyral and polyvinyl propional. The use of the binding resin is most preferred, however it is an optional component because the polymerizable component may itself be a good film former and can act as the binder for the other composition components to form a uniform layer. Suitable polymerizable components which also act as binders usually have a molecular weight of about 5,000 or more. Such may be polymers having terminal unsaturation as are well known in the art.

Dyes may be include to spectrally sensitize the photoinitiator, such as described in U.S. Pat. Nos. 4,282,309 and 4,454,218, and European Patent Application Nos. 0,179,448 and 0,211,615.

Other ingredients which may be present in the photopolymerizable layer are thermal polymerization inhibitors, plasticizers, oligomers, residual solvents, surfactants, inert fillers, antihalation agents, hydrogen atom donors, photoactivators, and optical brightening agents.

In the preferred embodiment, the dry photopolymerizable layer has a coating weight range of from about 0.1 to about 5 g/m². The more preferred coating weight is from about 0.4 to about 2 g/m².

In the practice of the present invention, the photopolymerizable monomer component is preferably present in the photosensitive layer in an amount ranging from approximately 20 to 70% based on the weight of the solids in the layer. A more preferred range is from approximately 30% to 60%.

In the practice of the present invention, the photoinitiator component is preferably present in the photosensitive layer in an amount ranging from approximately 2 to 30% based on the weight of the solids in the layer. A more preferred range is from approximately 6% to 20%.

In the practice of the present invention, the binding resin component, when it is used, is preferably present in the photosensitive layer in an amount ranging from approximately 10% to 75% based on the weight of the solids in the layer. A more preferred range is from approximately 40% to 70%.

One next prepares a photosensitive element which broadly comprises a support sheet having a release surface, a colored photosensitive layer on the release surface, and an adhesive layer on the photosensitive layer. In the preferrred embodiment, the supports sheet comprises any of the materials mentioned above as suitable for use as the cover sheet. The support sheet preferably has a release surface, that is, it is capable of releasably holding the photosensitive layer thereto. This may be accomplished by the support surface being either inherently releasable, rendered releasable by a suitable treatment, or provided with a release layer over the substrate surface. Such a release layer may comprise polyvinyl alcohol.

Releasably bonded to the release surface is the photosensitive layer. The photosensitive layer broadly comprises a photosensitizer, a colorant, a binder, and other optional ingredients such as plasticizers, stabilizers, surfactants, antistatic compositions, uv absorbers, optical brighteners, inert fillers, photoactivators, spectral sensitizers, antihalation agents, hydrogen atom donors, exposure indicators, polymerization inhibitors and residual coating solvents.

In one embodiment, the photosensitizer is preferably a light sensitive, negative-working polymeric diazonium salt. The most preferred photosensitizer is the polycondensation product of 3-methoxy-4-diazo-diphenyl amine sulfate and 4,4'-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents.

In another embodiment, the photosensitizer is preferably a light sensitive, positive-working o-naphthoquinone diazide. The most preferred photosensitizer is the ester of bis-(3-benzoyl-4,5,6-trihydroxy phenyl)-methane and 2-diazo-1-naphthol-5-sulfonic acid as taught in U.S. Pat. No. 4,407,926. Other suitable photosensitizers are taught in U.S. Pat. Nos. 3,106,365; 3,148,983; 3,201,239; and 4,266,001. The diazide compounds of choice are preferably soluble in organic solvents. It has been unexpectedly found that a positive image is produced on the receiver base whether positive working o-quinone diazides or negative working polymeric diazonium salts are used.

Dyes and/or pigments are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometers.

Nonexclusive examples of colorants usuable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color.

Binders found suitable for the photosenitive layer are styrene/maleic anhydride copolymers and their half esters; acrylic polymers and copolymers; polyamides; polyvinyl pyrrolidones; cellulose and its derivatives; phenolic resins; and polyvinyl acetals, such as polyvinyl formal, polyvinyl butyral, and polyvinyl propional.

Other ingredients which may be present in the photosensitive layer are the acid stabilizers, exposure indicators, thermal polymerization inhibitors, plasticizers, oligomers, residual solvents, surfactants, inert fillers, antihalation agents, hydrogen atom donors, photoactivators, and optical brightening agents.

In the practice of the present invention, the binder component is preferably present in the photosensitive layer in an amount sufficient to bind the composition components in a uniform mixture and a uniform film when it is coated on a substrate. It is preferably present in an amount ranging from about 10% to about 80% based on the weight of the solids in the layer. A more preferred range is from about 20% to about 70%.

In the preferred embodiment, when a diazonium salt or diazide compound is the photosensitizer component, it is present in the photosensitive layer in an amount of from about 5 to about 70 by weight; or more preferably from about 10 to about 50 by weight.

In the practice of the present invention, the colorant component is preferably present in an amount sufficient to uniformly color the photosensitive layer. It is preferably present in an amount ranging from about 5% to about 50% based on the weight of the solids in the layer. A more preferred range is from about 10% to about 40%.

Suitable acid stabilizers useful in the photosensitive composition layer include phosphoric, citric, benzoic, m-nitro benzoic, p(p-anilino phenylazo) benzene sulfonic acid, 4,4'-dinitro-2,2'-stilbene disulfonic, itaconic, tartaric, and p-toluene sulfonic acid, and mixtures thereof. Preferably, the acid stabilizer is phosphoric acid.

Exposure indicators (or photoimagers) which may be useful in conjunction in the photosensitive composition layer include 4-phenylazodiphenylamine, eosin, azobenzene, Calcozine, Fuchsine, Crystal Violet, and Methylene Blue dyes. Preferably, the exposure indicator is 4-phenylazodiphenylamine.

A plasticizer may also be included in the photosensitive composition layer of this invention to prevent coating brittleness and to keep the composition pliable if desired. Suitable plasticizers include dibutylphthalate, triarylphosphate and substituted analogs thereof and preferably dioctylphthalate.

To form the photosensitive composition layer, the composition components may be dissolved in a solvent or mixture of solvents to facilitate application of the composition to the substrate. Suitable solvents for this purpose may include water, tetrahydrofuran, gamma butyrolactone, glycol ethers such as propylene glycol monomethyl ether and methyl cellosolve, alcohols such as ethanol and n-propanol and ketones such as methyl ethyl ketone. In general, the solvent system is evaporated from the coating composition once it is applied to an appropriate substrate. However, some insignificant amount of solvent may remain as residue.

In the preferred embodiment, the photosensitive layer has a coating weight between approximately 0.1 and 5.0 g/m². The most preferred weight is from about 0.5 to 2.0 g/m².

The adhesive layer is next applied to the photosensitive layer. The purpose of the adhesive layer on the photosensitive layer is to aid in the transfer of the photosensitive layer to a receiver sheet and to protect the integrity of underlying, previous formed images during dry development of subsequent layer or layers. It may be applied to the photosensitive layer in several different ways. It can be coated directly onto the photosensitive layer out of organic or aqueous based solvent mixtures, or it can be applied by hot melt extrusion, lamination, or coating. The adhesive layer preferably comprises a major amount of one or more thermoplastic polymers and may optionally contain such other desired components as uv absorbers, antistatic compositions, optical brighteners, inert fillers, and plasticizers. Suitable polymers nonexclusively include vinyl acetal resins such as Butvar B-79 available from Monsanto; acrylic resins such as Elvacite 2044 available from DuPont; ethylene resins such as Elvax 210 available from DuPont; and vinyl chloride resins such as Hostaflex CM 133 available from Hoechst AG. Preferably the polymer is a vinyl acetate polymer or copolymer. Useful polyvinyl acetates nonexclusively include Mowilith DM-6, DM-22, 20, 25, 30 and mixtures thereof, available from Hoechst AG. These are usually dispersed in water, or dissolved in methyl isobutyl ketone or n-butyl acetate or other solvent compositions for coating on a photosensitive layer. It is then dried to a coating weight of from about 2 to about 30 g/m², more preferably from about 4 to about 20 g/m². The layer may optionally contain a uv absorber such as Uvinul D-50 available from GAF. It may also contain a plasticizer such as Resoflex R-296, available from Cambridge Industries. It may also contain antistats, such as Gafac and Gafstat available from GAF. It may also contain other resins such as Nitrocellulose RS ½, available from Hercules. The adhesive layer should not be tacky to the touch, during storage. The layer should be transferable to a receiver sheet in a temperature range of from about 60° C. to about 180° C., preferably 60° C. to 120° C., more preferably 60° C. to 100° C. when laminated with heat and pressure. In the preferred embodiment, the thermoplastic polymer or polymers are present in the adhesive layer in an amount of greater than about 50% by weight. The plasticizer may be present in an amount of up to about 30% by weight, the uv absorber up to about 20% by weight, and other resins up to about 50% by weight.

Typical adhesive formulations by weight for the photosensitive element nonexclusively include:

|  |  |  |
| --- | --- | --- |
| I. | isopropyl acetate | 80.00 |
|  | UCAR VYNC (Union Carbide) | 20.00 |
| II. | water | 50.00 |
|  | Mowilith DM-22 | 50.00 |
| III. | n-butyl acetate | 78.00 |
|  | Resoflex R-296 | 1.00 |
|  | Mowilith 30 | 21.00 |
| IV. | n-butyl acetate | 68.70 |
|  | Uvinul D-50 | 1.30 |
|  | Mowilith 20 | 30.00 |
| V. | n-butyl acetate | 85.00 |
|  | Mowilith 60 | 15.00 |

Receiver bases may comprise virtually any material which can withstand the laminating and dry development processes. White plastic sheets, such as adhesion pretreated polyester Melinex 3020 from ICI, are useful for this purpose. Plastic coated paper sheets, such as polyethylene coated paper from Schoeller, may also be used. Other bases may include wood, glass, metal, paper and the like.

Lamination may be conducted by putting the adhesive layer of the photosensitive element in contact with the receiver base and then introducing the materials into the nip of a pair of heated laminating rollers under suitable pressure. Suitable laminating temperatures usually range from approximately 60° to 120° C., preferably from 70° to 100° C. The support is then removed uncovering the photosensitive layer. At this stage the composite formed sequentially comprises a receiver base, adhesive layer and photosensitive layer. The photopolymerizable layer is then laminated under similar conditions to the photosensitive layer. The photosensitive layer and photopolymerizable layer are then simultaneously exposed by means well known in the art either before or after the adhesive layer is applied to the photosensitive layer. Such exposure may be conducted by exposure to actinic radiation from a light source through a conventional halftone positive color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

After exposure, a positive image is formed on the receiver base by stripping the transparent cover from the receiver base at room temperature with a steady, continuous motion. No devices are necessary to hold down the receiver base during stripping because only moderate manual peeling forces are needed to separate the materials. The preferred peel angle relative to the peel direction is greater than 90°. The delamination leaves the photoexposed areas of the photosensitive layer attached to the photopolymerizable layer and removed with the cover along with the unexposed areas of the photopolymerizable layer. The nonexposed areas of the photosensitive layer remain on the adhesive layer. The adhesive layer remains with the receiver base. Thus, a positive image with the adhesive remains on the receiver base. At this time, this positive image may be postexposed in order to destroy the photosensitizer present.

In order to attain a multicolored image, another photosensitive layer is laminated via another adhesive to the first image on the receiver base. The second photosensitive layer has preferably a different color than the first. After lamination to the same receiver, the support sheet of the second photosensitive layer is removed as was done with the first support. A second photopolymerizable element is prepared as above and similarly laminated to the photosensitive layer, exposed and the second color is dry developed by peeling the receiver base from the cover of the second photopolymerizable element. The second positive image with its adhesive remains with the first image. A third and a fourth image may be added in a manner similar to that used to produce the second image. In the usual case, four colored layers are employed to produce a full color reproduction of a desired image. These four colors are cyan, magenta, yellow, and black.

A matte finish of the final image may be obtained by embossing the shiny, top surface of the image with a matte material, such as Melinex 377 from ICI. This is done by laminating together the final image and matte material. The matte material is then generally removed after lamination. The advantage of this method is that the finish of the final proof can be determined by careful selection of the matting material.

The final four color proof may be given a uniform, blanket exposure to photoharden the nonexposed, colored areas on the receiver base. A protective layer may also be laminated on top of the last dry developed layer.

The following nonlimiting examples serve to illustrate the invention.

EXAMPLE 1

Photosensitive Diazonium Compound Containing Layer

The following photosensitive diazonium layer coating solution is mixed and coated on a polyester support sheet (Melinex 516, ICI) with a Meier #15 rod.

| | |
|---|---|
| Methyl Cellosolve | 35.54 g |
| Methyl Ethyl Ketone | 33.35 g |
| Diacetone Alcohol | 14.18 g |
| Half ester of styrene/maleic anhydride copolymer (Scripset 540, Monsanto) | 2.60 g |
| A variamine Blue Salt/p,p'bismethoxymethyl diphenylether (MMDPE) diazonium condensate as taught in U.S. Pat. No. 3,849,392 | 1.07 g |
| BYK 301 | 0.03 g |
| Blue Pigment Dispersion (contains, weight % Hostaperm Blue B2G, 6.5%, resin binder as taught in U.S. Pat. No. 4,670,507, 5.5% Dowanol PM-44%, Butyrolactone-44%) | 13.23 g. |

After drying, the photosensitive coating is overcoated with a thermoplastic adhesive solution (UCAR VYNC resin, 20% in isopropyl acetate, from Union Carbide) with a Meier #26 rod, and dried. Using heat and pressure, this element is laminated to a receiver sheet (Melinex 3020, ICI), and the support is stripped away, revealing the pigmented diazonium layer.

The following photopolymerizable element is prepared by coating the following photopolymer solution onto a strippable cover sheet (Melinex 505, ICI) with a #12 Meier rod.

| | |
|---|---|
| Nupol 46 - 4400 acrylic resin (Freeman) | 2 g |
| Polyvinyl butyral (Av. MW = 36,000, Tg - 51 C) | 1 g |
| 2-(4-styrylphenyl)-4,6-bis-trichloromethyl-s-triazine | 0.1 g |
| Tetrahydrofuran | 50 g |

After drying, this photopolymerizable element is laminated, using heat and pressure, to the pigmented diazonium layer in such a manner, that the photopolymerizable layer comes into direct contact with the pigmented diazonium layer. A positive target is placed on the strippable cover sheet and the composite is exposed to actinic radiation for 30 seconds in a Berkey-Ascor exposure unit. Change of color (yellowish to greyish) of the exposed areas of the diazonium layer indicates that this layer obtains enough light to destroy the diazonium compound. Peel development results in the exposed areas of the pigmented diazo layer being removed due to their attachment to the polymerized areas of the photopolymer layer. A good-quality pigmented positive image remains on the thermoplastic adhesive layer attached to the support sheet.

EXAMPLE 2

Example 1 is repeated, except the photopolymer layer does not contain the photoinitiator 2-(4-styrylphenyl)-bis-trichloromethyl-s-triazine. After exposure and peel development, no image is obtained.

EXAMPLE 3

Example 1 is repeated, except the pigmented layer does not contain the diazonium compound, that is the Variamine Blue Salt/MMDPE diazonium condensate. After exposure and peel development, no image is obtained.

Examples 2 and 3 show, that the presence of both the diazonium compound and photopolymerization is necessary in the practice of the present invention.

EXAMPLE 4

Photosensitive o-quinonediazide Containing Layer

The following photosensitive solution is coated on a polyester support (Melinex 516) with a 15 Meier rod.

| | |
|---|---|
| Dowanol PM | 14.00 g |
| Methyl Ethyl Ketone | 18.83 g |
| Diacetone alcohol | 5.17 g |
| Butyrolactone | 4.76 g |
| Half ester of styrene/maleic anhydride copolymer (Scripset 550, Monsanto) | 0.66 g |
| Polyvinyl butyral (Butvar B-90, Monsanto) | 0.25 g |
| Ester of bis(3-benzoyl-4,5,6-trihydroxphenyl) methane and 2-diazo-1-naphthol-5-sulfonic acid, as taught in U.S. Pat. No. 4,407,962 | 1.32 g |
| Blue Pigment Dispersion from Example 1 | 10.38 g |

After drying, the photosensitive coating is overcoated with a thermoplastic adhesive solution (UCAR VYNC, 20% in isobutyl acetate) with a #25 Meier rod, and dried. Using heat and pressure, this element is laminated to a receiver sheet (Melinex 3020), and the support is stripped away, revealing the pigmented o-quinonediazide layer.

A photopolymer element is prepared by coating the following photopolymer solution onto a strippable cover sheet (Melinex 505) with a #12 Meier rod.

| | |
|---|---|
| Nupol 46-4400 acrylic resin (Freeman) | 2 g |
| Polyvinyl butyral (Butvar 79, Monsanto) | 1 g |
| 2-(4-styrylphenyl)-4,6-bis-trichloromethyl-s-triazine | 0.1 g |
| BYK 301 | 0.05 g |
| Tetrahydrofuran | 50 g |

After drying, this photopolymerizable element is laminated, using heat and pressure, to the pigmented photosensitive element containing the o-quinonediazide compound in such a manner, that the photopolymerizable layer comes into direct contact with the pigmented o-quinonediazide layer. A positive target is placed on the strippable cover sheet and the composite is exposed to actinic radiation for 30 seconds. Peel development results in the exposed areas of the pigmented o-quinonediazide layer being removed due to their attachment to the polymerized areas of the photopolymer layer. A good-quality, positive image remains on the thermoplastic adhesive layer attached to the support sheet.

EXAMPLE 5

Example 4 is repeated, except the pigmented layer does not contain the o-quinonediazide compound, the ester of bis(3-benzoyl-4,5,6-trihydroxphenyl) methane and 2-diazo-1-naphthol-5-sulfonic acid. After exposure and peel development, no image is obtained.

EXAMPLE 6

Example 4 is repeated, except the photopolymer layer does not contain the photoinitiator, the 2-(4-styrylphenyl)-4,6-bis-trichloromethyl-s-triazine. After exposure and peel development, no image is obtained.

EXAMPLE 7

The photosensitive diazonium element from Example 1 is used. The photopolymer element is prepared by coating the following photopolymer solution onto strippable cover sheet (Melinex 505) with a #12 Meier rod.

| | |
|---|---|
| QM 9200 monomer (trimethylolpropane based trifunctional acrylic monomer, Rohm and Haas) | 2 g |
| UCAR VYNC resin (20% solution in isopropyl acetate, Union Carbide) | 20 g |
| 2-(4-styrylphenyl)-4,6-bis-trichloromethyl-s-triazine | 0.1 g |
| N-butyl acetate | 30 g |

Following the procedure from Example 1 gives a good quality positive blue image on the adhesive layer.

EXAMPLE 8

Photosensitive diazonium Layer

The following photosensitive coating solution is coated on a polyester support sheet (Melinex 516) with a #15 Meier rod.

| | |
|---|---|
| Methyl Ethyl Ketone | 38.72 g |
| Diacetone alcohol | 16.01 g |
| Dowanol PM | 30.91 g |
| Half ester of styrene/maleic anhydride copolymer (Scripset 540, Monsanto) | 2.23 g |
| A Variamine Blue Salt/MMDPE diazonium condensate from Example 1 | 0.93 g |
| BYK 301 | 0.022 g |
| Yellow Pigment Dispersion (contains weight %: Hostaperm Yellow GR - 5.0%, resin as taught in U.S. Pat. No. 4,670,507 - 6.0%, Dowanol PM - 44.5%, Butyrolactone - 44.5%) | 11.17 g |

After drying, the photosensitive coating is overcoated with a thermoplastic adhesive solution (UCAR VYNC, 20% solution in isopropyl acetate, Union Carbide) with a #26 Meier rod, and dried. Using heat and pressure, this element is laminated to a receiver sheet (Melinex 3020), and the support is stripped away, revealing the diazonium layer.

PHOTOPOLYMERIZABLE LAYER.

The photopolymer element is prepared by coating the following photopolymer solution onto a strippable cover sheet (Melinex 505) with a #12 Meier rod.

| | |
|---|---|
| Photomer 4072 (Trimethylolpropane propoxylate triacrylate, Henkel Corp.) | 2.5 g |
| UCAR VYNC (20% solution in isopropyl acetate, Union Carbide) | 20 g |
| 2-(4-styrylphenyl)-4,6-bis-trichloromethyl-s-triazine | 0.2 g |
| N-butyl acetate | 70 g |

After drying, this photopolymerizable element is laminated, using heat and pressure, to the photosensitive diazonium layer in such a manner, that the photopolymerizable layer comes into direct contact with the photosensitive diazonium layer. A positive target is placed on the strippable cover sheet and the composite is exposed to actinic radiation for 30 seconds (with a Berkey-Ascor exposure unit). Peel development results in the exposed areas of the diazonium layer being removed together with the polymerized areas of the photopolymer layer. A good quality, positive yellow image remains on the thermoplastic adhesive.

EXAMPLE 9

Example 8 is repeated, except the photoinitiator, the 2-(4-styrylphenyl)-4,6-bis-trichloromethyl-s-triazine is replaced by 0.2 g of 2,3-bis(4-methoxyphenyl) quinoxaline in the photopolymer solution. 60 seconds exposure of the final composite and peel development gives a good quality positive yellow image on the thermoplastic adhesive.

EXAMPLE 10

In order to prepare a four-color single sheet proof, the following four photosensitive diazonium solutions are prepared.

I. Cyan solution from Example 1.
II. Yellow solution from Example 8.
III. Magenta solution of the following composition:

| | |
|---|---|
| Diacetone alcohol | 25.37 g |
| Tetrahydrofuran | 13.20 g |
| Ethyl alcohol | 14.20 g |
| Dowanol PM | 30.44 g |
| Scripset 540 | 2.25 g |
| Variamine Blue Salt/MMDPE diazonium condensate from Example 1 | 0.90 g |
| Magenta Pigment Dispersion (consists in weight %: Permanent Carmine - 5.2%, binder resin as taught in U.S. Pat. No. 4,670,507 - 5.2%, Dowanol PM - 44.8%, Butyrolactone - 44.8%) | 12.83 g |
| IV. Black solution of the following composition: | |

-continued

| | |
|---|---|
| Methyl Cellosolve | 40.78 g |
| Methyl Ethyl Ketone | 26.90 g |
| Diacetone alcohol | 12.62 g |
| Scripset 540 | 2.47 g |
| Variamine Blue Salt/MMDPE diazonium condensate from Example 1 | 0.90 g |
| Black Pigment Dispersion (consists in weight %: Carbon Black - 5.5%, binder resin as taught in U.S. Pat. No. 4,670,507 - 4.5%, Dowanol PM - 45%, Butyrolactone - 45%) | 15.70 g. |

The yellow pigmented diazonium solution from example 8 is coated dried, overcoated with adhesive, dried, transferred, and laminated to the photopolymer element which is prepared from the following solution:

| | |
|---|---|
| bisphenol A diepoxide dimethacrylate (Polysciences) | 10 g |
| UCAR VYNC (20% solution in isopropyl alcohol) | 50 g |
| Dowanol PM | 50 g |
| tetrahydrofuran | 50 g |
| 2-(4-styrylphenyl)-4,6-bis-trichloromethyl-s-triazine | 0.2 g |

Imagewise exposure to actinic radiation through a positive yellow separation and peel development gives a yellow positive image on the adhesive layer.

To this image, there is laminated the second pigmented diazonium layer, namely the cyan layer, which is previously coated on a support and overcoated with an adhesive solution as in Example 8. Removal of the support, lamination of the photopolymerizable element to the cyan diazonium layer, and subsequent exposure through a positive cyan separation and peel development gives a cyan image on top of the second adhesive layer. Repeating this procedure for the two remaining colors and optional post-exposure gives a four-color single sheet proof.

EXAMPLE 11

The black photosensitive diazonium solution from Example 10 is used. After coating on the support (Melinex 516) and drying, the black photosensitive diazonium layer is overcoated with an acrylic adhesive solution (Acryloid B48-N, Rohm and Haas, 10% solution in N-butyl acetate) with #26 Meier rod and dried. This element is then laminated to a receiver sheet (Melinex 3020), and the support is stripped off revealing the photosensitive layer. To this layer there is laminated the photopolymerizable element from Example 8 in such a manner, that the photopolymer layer comes into direct contact with the diazonium layer. Imagewise exposure through a positive target and peel development leaves a positive image on the acrylic adhesive layer.

What is claimed is:

1. A method for producing a positive image which comprises
  (a) providing a photopolymerizable element which comprises:
    (i) a strippable, transparent cover; and
    (ii) a photopolymerizable composition layer on said cover, which photopolymerizable layer comprises a photoinitiator, a free radical polymerizable component having at least one ethylenically unsaturated group, and an optional organic binding resin, wherein said photoinitiator is present in sufficient amount to initiate the free radical polymerization of said polymerizable component upon exposure to sufficient actinic radiation, and wherein said polymerizable component is present in sufficient amount to provide image differentiation when the composition is imagewise exposed to actinic radiation; and wherein said optional binding resin, when present, is in sufficient amount to bind the composition components into a uniform film, and
  (b) providing a photosensitive element which comprises
    (i) a support sheet; and
    (ii) a photosensitive composition layer directly on said support sheet, which photosensitive layer comprises an organic binder, a light sensitive polymeric diazonium compound or o-quinone diazide compound, and a colorant, wherein said binder is present in sufficient amount to bind the composition components into a uniform film, and wherein said light sensitive compound is present in sufficient amount to provide image differentiation when the photosensitive composition is imagewise exposed to actinic radiation; and wherein said colorant is present in an amount sufficient to uniformly color the layer; and
    (iii) an adhesive layer directly adhered to said photosensitive composition layer, which adhesive layer comprises a thermoplastic resin which has a $T_g$ in the range of from about 25° C. to about 100° C.; and
  (c) providing a receiver sheet; and
  (d) laminating the photosensitive element to the receiver sheet with heat and pressure such that the adhesive layer adheres to the receiver sheet and thereafter removing the support sheet thereby transferring the adhesive layer and photosensitive composition layer to the receiver sheet; and
  (e) laminating the photopolymerizable layer to the photosensitive layer at elevated temperature and pressure such that the photopolymerizable composition layer adheres to the photosensitive composition layer; and
  (f) then imagewise exposing said photosensitive composition and said photopolymerizable composition through the transparent cover to actinic radiation; and
  (g) peeling apart said receiver sheet and said transparent cover thereby forming a positive image on the adhesive layer on said receiver sheet; and
  (h) optionally repeating steps (a), (b) and (d) through (g) at least once wherein another photosensitive element according to step (b) having at least one different colorant is transferred via its adhesive layer to the positive image on the receiver sheet produced from the previous photosensitive element and photopolymerizable element.

2. The method of claim 1 wherein said transparent cover comprises polyethylene terephthalate.

3. The method of claim 1 wherein said photopolymerizable composition comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, trimethylolpropane propoxylate triacrylate, and bisphenol A diepoxide dimethacrylate.

4. The method of claim 1 wherein said photopolymerizable composition comprises one or more photoinitiators selected from the group consisting of 2,3-di(4-methoxyphenyl)quinoxaline, 9-phenylacridine, bis(2,4,5-triphenyl)imidazole, bis-trichloromethyl-s-triazine and their derivatives.

5. The method of claim 1 wherein said photopolymerizable composition comprises one or more binding resins selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers.

6. The method of claim 1 wherein the free radical polymerizable component is present in said photosensitive layer in an amount ranging from about 30% to about 60% by weight of the photosensitive composition.

7. The method of claim 1 wherein the photoinitiator component is present in said photosensitive layer in an amount ranging from about 2% to about 30% by weight of the photosensitive composition.

8. The method of claim 1 wherein the binder is present in said photosensitive layer in amount ranging from about 10% to about 75% by weight of the photosensitive composition.

9. The method of claim 1 wherein said support comprises polyethylene terephthalate.

10. The method of claim 1 wherein the photosensitive layer comprises a polymeric diazonium salt which is the polycondensation product of 3-methoxy-4-diazo-diphenyl amine sulfate and 4,4'-bis-methoxy methyl-diphenyl ether precipitated as mesitylene sulfonate.

11. The method of claim 1 wherein the photosensitive layer comprises a diazide which is the ester of bis-(3-benzoyl-4,5,6 trihydroxy phenyl)-methane and 2-diazo-1-naphthol-5-sulfonic acid.

12. The method of claim 1 wherein the photosensitive layer comprises a binder selected from the group consisting of styrene/maleic anhydride copolymers and their half esters; acrylic polymers and copolymers; polyamides; polyvinyl pyrrolidones; cellulose and its derivatives; phenolic resins; and polyvinyl acetals.

13. The method of claim 1 wherein said photosensitive layer further comprises one or more ingredients selected from the group consisting of plasticizers, stabilizers, antistatic compositions, uv absorbers, spectral sensitizers, optical brighteners, inert fillers, exposure indicators, polymerization inhibitors, oligomers, surfactants, hydrogen atom donors, antihalation agents, and photoactivators.

14. The method of claim 1 wherein the coating weight of the photosensitive layer ranges from about 0.1 to 5.0 g/m$^2$.

15. The method of claim 1 wherein said adhesive layer of the carrier further comprises one or more ingredients selected for the group consisting of plasticizers, uv absorbers, antistatic compositions, inert fillers, antihalation agents, and optical brighteners.

16. The method of claim 1 wherein said adhesive layer has a coating weight of from about 2 to about 30 g/m$^2$.

17. The method of claim 1 wherein the said receiver sheet comprises paper, coated paper, or polymeric film.

18. The method of claim 1 wherein each lamination is conducted at a temperature of from about 60° C. to about 120° C.

19. The method of claim 1 further comprising the subsequent step of providing a protective covering on the imagewise nonexposed portions of the photosensitive layer on the receiver sheet.

20. A positive-acting proofing sheet which comprises, in order:
(i) a strippable, transparent cover; and
(ii) a photopolymerizable composition layer on said cover, which photopolymerizable layer comprises a photoinitiator, a free radical polymerizable component having at least one ethylenically unsaturated group, and an optional organic binding resin, wherein said photoinitiator is present in sufficient amount to initiate the free radical polymerization of said polymerizable component upon exposure to sufficient actinic radiation, and wherein said polymerizable component is present in sufficient amount to provide image differentiation when the composition is imagewise exposed to actinic radiation; and wherein said optional binding resin, when present, is in sufficient amount to bind the composition components into a uniform film, and
(iii) a photosensitive composition layer directly on said photopolymerizable composition, which photosensitive layer comprises an organic binder, a light sensitive polymeric diazonium compound or o-quinone diazide compound, and a colorant, wherein said binding resin is present in sufficient amount to bind the composition components into a uniform film, and wherein said light sensitive compound is present in sufficient amount to provide image differentiation when the photosensitive composition is imagewise exposed to actinic radiation; and wherein said colorant is present in an amount sufficient to uniformly color the layer; and
(iv) an adhesive layer directly adhered to said photosensitive layer, which adhesive layer comprises a thermoplastic resin which has a $T_g$ in the range of from about 25° C. to about 100° C.; and
(v) a support sheet attached to the adhesive layer.

21. A method for producing a positive image which comprises:
(a) providing a photopolymerizable element which comprises:
(i) a strippable, transparent cover; and
(ii) a photopolymerizable composition layer on said cover, which photopolymerizable layer comprises a photoinitiator, a free radical polymerizable component having at least one ethylenically unsaturated group, and an optional organic binding resin, wherein said photoinitiator is present in sufficient amount to initiate the free radical polymerization of said polymerizable component upon exposure to sufficient actinic radiation, and wherein said polymerizable component is present in sufficient amount to provide image differentiation when the composition is imagewise exposed to actinic radiation; and wherein said optional binding resin, when present, is in sufficient amount to bind the composition components into a uniform film, and
(b) providing a photosensitive element which comprises
(i) a support sheet; and (ii) an adhesive layer directly adhered to said support sheet, which adhesive layer comprises a thermoplastic resin which has a $T_g$ in the range of from about 25° C. to about 100° C.; and (iii) a photosensitive composition layer directly on said adhesive layer, which photosensitive layer comprises an organic binder, a light sensitive polymeric diazonium compound or o-quinone diazide compound, and a colorant, wherein said binding resin is present in sufficient amount to bind the composition components into a uniform film, and wherein said light sensitive compound is present in sufficient amount to provide image differentiation when the photosensitive composition is imagewise exposed to actinic radiation; and wherein said colorant is present in an amount sufficient to uniformly color the layer; and (c) laminating the photopolymerizable element to the photosensitive element at elevated temperature and pressure such that the photosensitive composition layer adheres to the photopolymerizable composition layer; and (d) then imagewise exposing said photosensitive composition and said photopolymerizable composition through the transparent cover to actinic radiation; and (e) peeling apart said support sheet and said transparent cover thereby forming a positive image on the adhesive layer on said support.

* * * * *